United States Patent

[11] 3,615,451

[72] Inventor Ernst-August Hackmann
Wiesbaden-Dotzheim, Germany
[21] Appl. No. 755,828
[22] Filed Aug. 28, 1968
[45] Patented Oct. 26, 1971
[73] Assignee Kalle Aktiengesellschaft
Wiesbaden-Biebrich, Germany
[32] Priority Aug. 31, 1967
[33] Germany
[31] P 15 97 785.2

[54] PRINTING PLATE HAVING A PHOTOACTIVE LAYER
13 Claims, No Drawings

[52] U.S. Cl. .......... 96/35.1, 96/33, 96/115 P, 96/90 R
[51] Int. Cl. .......... G03c 1/70
[50] Field of Search .......... 96/115 P, 35.1, 90

[56] References Cited
UNITED STATES PATENTS

| | | | |
|---|---|---|---|
| 3,042,518 | 7/1962 | Wainer | 96/115 X |
| 3,374,094 | 3/1968 | Wainer et al. | 96/90 X |
| 3,479,185 | 11/1969 | Chambers | 96/115 X |
| 3,495,987 | 2/1970 | Moore | 96/115 |

FOREIGN PATENTS

| | | | |
|---|---|---|---|
| 1,490,910 | 6/1967 | France | 96/115 |

*Primary Examiner*—Ronald H. Smith
*Attorney*—James E. Bryon

ABSTRACT: This invention relates to a light-sensitive material, particularly a printing plate having a photopolymerizable layer, which layer contains a photochemically initiatable organic halogen compound and a compound corresponding to one of the following general formulae:

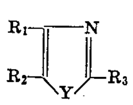

or

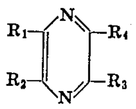

wherein $R_1$ and $R_2$ which may be identical or not, are aryl or heteroyl groups which may be substituted, or form members of an aromatic or pyridine ring, $R_3$ is $-CH\ CH_2$ or $-RCH\ CH_2$, with R being arylene, naphthalene, or heteroylene, $R_4$ is either identical with $R_3$, or is an aryl or heteroyl group which may be substituted, and Y is NH, S, Se, or O.

PRINTING PLATE HAVING A PHOTOACTIVE LAYER

This invention relates to a printing plate having a photoactive layer containing a photolytically effective organic halogen compound, which layer changes its solubility characteristics in the light-struck areas during imagewise exposure to light so that it is possible to remove the unexposed areas with a suitable solvent and to convert the plate into an offset plate or a relief plate, depending on the kind of support used and the thickness of the layer.

Printing plates having photopolymerizable reproduction layers are known, which layers contain polymerizable compounds having olefinic double bonds, together with components which initiate their polymerization during exposure to light. The light-sensitivity of these layers is not always sufficient so it has been suggested to perform photopolymerization of the reproduction layer with the exclusion of oxygen. This method is time-consuming and cumbersome and thus is only infrequently employed.

Other known light-sensitive systems are those in which the light-sensitivity is influenced little or not at all by the oxygen in the air. Exemplary are systems using photoactive halogen compounds which contain as polymerizable substances N-vinylamines, N-vinylamides, and N-vinylimides. The preferably employed substance is N-vinylcarbazole. In order to obtain a visible image of the original after exposure to light, heating is necessary in the case of these known layers or leucotriarylmethane dyestuffs or bisheteroylarylmethanes or cyanine or merocyanine color bases must be added. The light-sensitivity generally is considerably increased by such additives. A disadvantage of such systems is their limited storability in the dark. The layers polymerize slowly at room temperature, more rapidly at a somewhat higher temperature, and can not be completely developed even after a short time.

The printing layer of the present invention comprises a C-vinyl compound and photoactive halogen compounds and provides an improvement over the systems outlined above.

The present invention provides a printing plate having a photopolymerizable layer, which latter contains a photochemically initiatable organic halogen compound and a compound corresponding to one of the following general formulae:

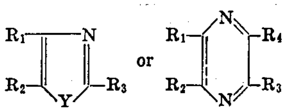

wherein $R_1$ and $R_2$ which may be identical or not, are aryl or heteroyl groups which may be substituted, or form members of an aromatic or pyridine ring, $R_3$ is $-CH{=}CH_2$ or $-RCH{=}CH_2$, with R being arylene, naphthalene, or heteroylene, $R_4$ is either identical with $R_3$, or is an aryl or heteroyl group which may be substituted, and Y is NH, S, Se, or O.

Examples of suitable light-sensitive heterocyclic compounds containing vinyl groups, which yield particularly good results in accordance with the invention, are listed in tables I and II below:

TABLE I

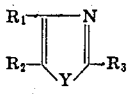

| | $R_1$ | $R_2$ | $R_3$ | Y |
|---|---|---|---|---|
| 1 | 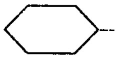 | 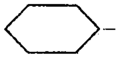 | $-CH{=}CH_2$ | O |
| 2 | 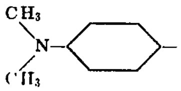 | 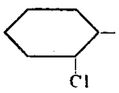 | | |
| 3 | 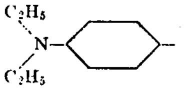 | | | |
| 4 | 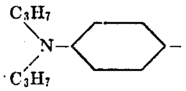 | | | |
| 5 | 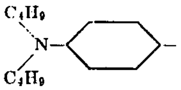 | | | |
| 6 | 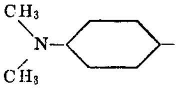 | 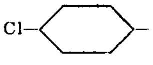 | $-CH{=}CH_2$ | O |
| 7 | ............ |  | | |
| 8 | 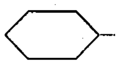 | 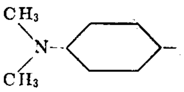 | | |
| 9 | 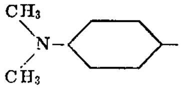 | 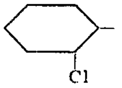 | ............ | S |
| 10 | ............ | ............ | ............ | Se |
| 11 | ............ | ............ | ............ | NH |

Table I – Continued

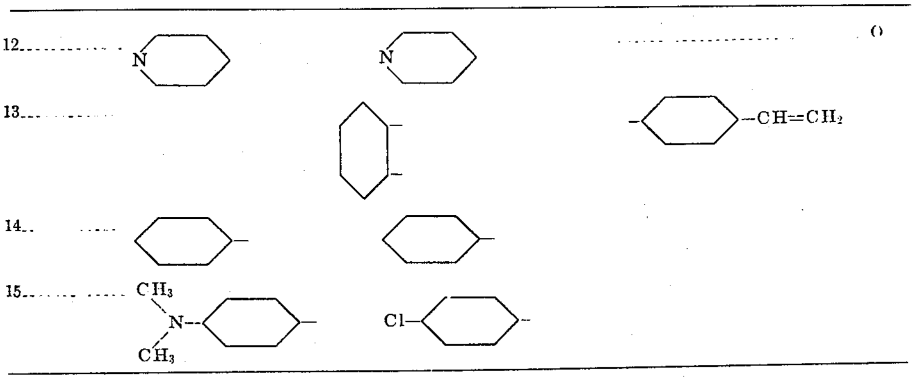

TABLE II

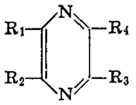

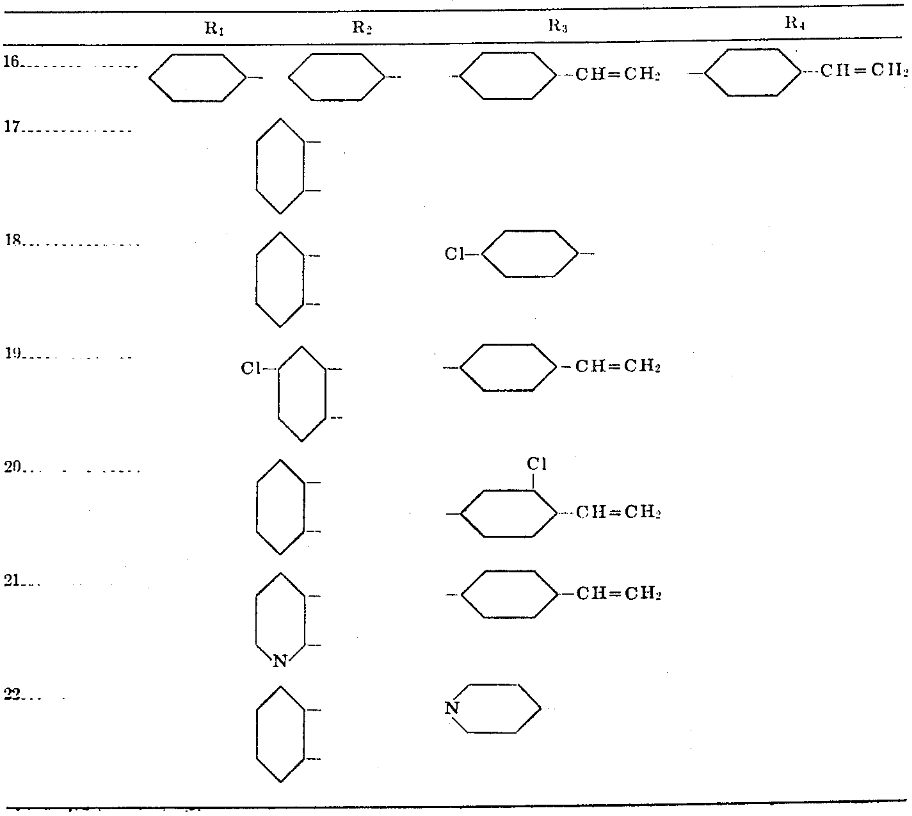

Known photochemically initiatable organic halogen compounds are those of the following general formula:

$$R_2-\underset{R_3}{\overset{R_1}{\underset{|}{\overset{|}{C}}}}-X$$

wherein X is chlorine, bromine, or iodine, and $R_1$, $R_2$, $R_3$, which may be identical or not, are chlorine, bromine, iodine, hydrogen, alkyl which may be substituted by chlorine, bromine, or iodine; or aryl, aralkyl, alkenyl, or a heterocyclic group.

Within this generally indicated group of halogenated compounds splitting off halogen during exposure to light, there should be particularly pointed out tetrabromomethane, pentabromoethane, iodoform, tribromomethylphenylsulfone, and ω, ω, ω-tribromoacetophenone which may be mono- or multisubstituted in the aromatic ring by halogen-alkoxy-alkyl or nitro groups, e.g. 3-nitro-ω, ω, ω-tribromoacetophenone or 2,5-dimethyl-ω, ω, ω-tribromoacetophenone. Tetrabromo- and tetraiodopyrrole, tetraiodothiophene and tetrabromothiophene as well as hexachloroethane and tetraiodomethane are also suitable. These compounds, which may be contained individually or in admixture in the light-sensitive layer of the reproduction material of the invention, cause an increase of the light-sensitivity of the already light-sensitive C-vinyl compounds and yield as visible image after exposure to light. In contradistinction to the layers with N-vinyl compounds, the layers with the C-vinyl compounds of the invention and the halogen compounds are storable in the dark.

The reproduction layer may consist exclusively of the heterocyclic vinyl compounds according to the invention or mixtures thereof and the halogenated hydrocarbons, which has the advantage that a good differentiation between the exposed and unexposed areas can be achieved by development with dilute aqueous acids, e.g. phosphoric acid. In some cases, it may be advantageous to add binding agents to the reproduction layer. In addition to causing a good adhesion of the layer to the support, they render the layer easily developable. The binders must dissolve readily in developing agents which do not attack the exposed layer. Since it is desirable, from the point of view of facilitating the printing process, to work with alkaline developer solutions, those binders are preferred which contain groups rendering them alkali-soluble. Such groups are, for example, acid anhydride groups, carboxylic groups, sulfonic acid groups, sulfonamide groups, or sulfonimide groups. Preferably employed are resins with high acid numbers since they dissolve particularly easily in alkaline solutions. Copolymers of styrene and maleic anhydride have proved to be particularly suitable.

The proportion of binder may vary within wide limits. Favorable results are generally obtained with a binder content of 0.1 to 2 parts of binder per part of light-sensitive substance.

Furthermore, known sensitizers, such as dyestuffs or dyestuff mixtures, may be added to the layers according to the invention in order to increase their light-sensitivity. Thioflavine is excellently suited as a dyestuff sensitizer but Dianil Yellow 3G and Eosine yellow also may be used with advantage.

The photopolymerizable layers known to the prior art frequently have cross-linking agents incorporated therein, such as unsaturated compounds containing at least two vinyl groups. Compounds of this type are described in "Industrial and Engineering Chemistry," Vol. 31, No. 12/1949, for example. The addition of such cross-linking agents to the reproduction layer of the invention favorably influences its final hardness so that more uniform and longer printing runs can be achieved.

All materials known for this purpose may be used as supports for the reproduction layers of the invention, e.g. metals, paper, or plastic films. Alternatively, the reproduction layer may be used directly as a printing plate when it is in the form of a self-supporting film.

The printing plates according to the present invention are prepared in known manner. A solution containing the components is applied to the support. A mixture of toluene and methyl glycol is preferred as the solvent, but other solvents conventionally used for this purpose also may be used.

Coating is also performed in a conventional manner, by whirl-coating or brushing in coating machines.

Self-supporting reproduction layers may be produced by casting or extrusion.

The printing plates of the invention are processed in known manner. Normally, they are exposed to light by the contact process, but episcopic or diascopic exposure is also possible. Excellent results are obtained by screening by means of a contact screen or an engraved glass plate. Negative originals preferably are used because the reproduction material reverses the tone values so that positive copies are produced.

The range of radiation emitted by the light-source used must be adapted to the range in which the layer has its maximum light-sensitivity. Since many of the compounds to be used according to the invention are particularly light-sensitive within the range of ultraviolet light, it is advisable to use such light sources as carbon arc lamps, mercury vapor lamps, fluorescent lamps containing fluorescent substances which specially emit ultraviolet light, and also argon glow discharge lamps.

After exposure to light, the plates must be developed because the unexposed areas have retained their light-sensitivity. Normally, development is effected by wiping over with a suitable solvent mixture which dissolves the unexposed areas away but does not attack the exposed areas. Solvent mixtures containing water, methanol, ethylene glycol and glycerol, with sodium metasilicate dissolved therein, have proved to be of advantage. Acid developers, such as aqueous phosphoric acid solutions, are also suitable. The use of alkaline or acid developers depends upon the layer composition.

After development, the image areas of the layer are hydrophobic and accept printing ink.

By deep-etching, by means of a one-step or two-step etching process, letter-press printing forms may be obtained. When relief printing plates are to be prepared from which only a short run is expected, it is not necessary for the reproduction layers to be fully exposed.

The printing form may be further improved and still longer runs may be achieved by lacquering the form with a lacquer which is absorbed by the image areas only and does not adhere to the nonimage areas. Conventional lacquers of this type are described in DAS 1,143,710, and Belgian Pat. Ser. No. 625,787, for example.

In addition to the advantages resulting from its already light-sensitive C-vinyl compounds, as described above the layers of the invention have a good light-sensitivity and do not require photopolymerization catalysts, the printing plate of the invention has a further increased light-sensitivity and, after exposure to light, yields a visible image, which is particularly advantageous when the plate is used in step-and-repeat machines. A further advantage of the light-sensitive layer of the invention is the good storability thereof in the dark.

The invention will be further illustrated by reference to the following specific examples:

EXAMPLE 1

One g. of 2-vinyl-4-(4′-diethylaminophenyl)-5-(2″-chlorophenyl)-oxazole (abbreviated in the following by "-vinyloxazole") according to formula 3 above and 1 g. of a maleic anhydride / styrene copolymer (commercial product Lytron 820(R) of Monsanto) were dissolved in 10 ml. of toluene and 10 ml. of methyl glycol and the solution was applied by means of a plate whirler at 120 revolutions per minute to a support of brushed aluminum; the solvent was removed with a stream of warm air. Exposure to light was carried out using a carbon arc lamp and subsequent decoating was effected with an alkaline developer. The developer consisted of a solution of sodium metasilicate (5 parts by weight) in water (20 parts by weight), methanol (20 parts by weight), glycerol (20 parts by weight), and ethylene glycol (30 parts by weight). After hydrophilizing with dilute phosphoric acid, the material was inked up with printing ink. The exposure time was 1 to 7 minutes with an interval of 1 minute. Plates containing additionally 1 g. of one of the halogen compounds indicated in the following table were treated analogously. The exposure time also was 1 to 7 minutes.

The following table shows the developability of the layers, a dash (−) means that the layer was completely removed from the plate by the developer. The question mark (?) indicates that some image areas adhere and others, however, are attacked by the developer. The plus sign (+) indicates that the image areas adhere to the plate, but the nonimage areas are completely removed.

| Components of the layer | | | Exposure to light in minutes | | | | | | |
|---|---|---|---|---|---|---|---|---|---|
| | | | 1 | 2 | 3 | 4 | 5 | 6 | 7 |
| Vinyl oxazole | Lytron 820(R) | | − | − | − | ? | ? | + | + |
| Do | do | Tetrabromomethane | ? | ? | + | + | + | + | + |

| | | | | | | | | | |
|---|---|---|---|---|---|---|---|---|---|
| Do | do | Tribromomethyl-phenylsulfone. | + | + | + | + | + | + | + |
| Do | do | Iodoform | ? | + | + | + | + | + | + |
| Do | do | Pentabromoethane | ? | ? | ? | + | + | + | + |
| Do | do | 3-nitro-tribromoaceto-phenone. | — | ? | + | + | + | + | + |
| Do | do | 2,5-dimethyltribromo-acetophenone. | + | + | + | + | + | + | + |

The table clearly shows that the layers including halogen compounds require substantially shorter exposure times than layers without a halogen compound. In the case of the plate of the first line, no image or an extremely weak image can be seen after exposure to light. The layers with halogen compounds, however, show a yellowish-brown to brownish-red image after exposure to light.

A similar result is obtained when the binding agent Lytron $820^{(R)}$ is omitted; but development must be performed with dilute phosphoric acid.

Similar results are obtained when Lytron $820^{(R)}$ is replaced by other binding agents, e.g. by those of the polyacrylic ester type (trade name Plexigum MB $319^{(R)}$), epoxide resins (trade name Epikote 1001, 1007, $1009^{(R)}$) or phenoplasts of the novolak type (trade name Alnovol $424^{(R)}$).

EXAMPLE 2

0.5 g. of 2,3-di-(4-vinylphenyl)-quinoxaline (according to Formula 17 above) and 1 g. of Lytron $820^{(R)}$ were dissolved in 25 ml. of toluene and 25 ml. of methyl glycol, a plate of brushed aluminum was coated with the solution, the plate was dried and exposed to an arc lamp under a 20-step Kodak wedge for 10 seconds. After development with the developer of example 1 and inking up with printing ink, the first wedge step accepts printing ink slightly. If 0.5 g. of 2,5-dimethyl-tribromoacetophenone is added to the layer, the fourth wedge step still can be distinctly discerned, i.e. the light-sensitivity of the layer with the halogen compound is considerably higher. In the case of this plate, a strong yellow image can be recognized after exposure to light. Layers without halogen compounds show only an extremely weak image after exposure to light.

EXAMPLE 3

Printing plates having a light-sensitive layer consisting of 1 g. of vinyl oxazole (according to formula 3 above) and 0.5 g. of 2,5-dimethyl-ω, ω, ω-tribromoacetophenone were stored for 40 days in a room having a temperature of 40° C. and a relative humidity of 65 percent. After this storage, the plates could be developed without difficulty and still had the same light-sensitivity compared with unstored plates. Similar results were achieved with layers containing 1 g. of quinoxaline derivative (according to formula 17 above), 2 g. of Lytron $820^{(R)}$ and 0.5 g. of tribromomethylphenylsulfone.

On the other hand, printing plates with layers containing 1 g. of N-vinyl carbazole, 0.5 g. of tribromomethyl-phenylsulfone and 1 g. of Lytron $820^{(R)}$ did not yield clean images upon development after about 12 hours storage.

It will be obvious to those skilled in the art that many modifications may be made within the scope of the present invention without departing from the spirit thereof, and the invention includes all such modifications.

What is claimed is:

1. Light-sensitive photopolymerizable material comprising a layer containing a photolytically effective halogenated organic compound and at least one C-vinyl compound corresponding to one of the following general formulae:

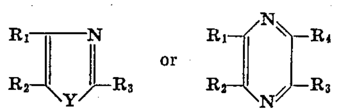

in which $R_1$ and $R_2$ are selected from the group consisting of aryl and pyridyl groups or, taken together form members of an aromatic or pyridine ring; $R_3$ is selected from the group consisting of $-CH{=}CH_2$ or $-RCH{=}CH_2$, in which R is selected from the group consisting of arylene and naphthalene groups; $R_4$ is selected from the group consisting of groups identical with $R_3$ and aryl groups; and Y is selected from the group consisting of NH, S, Se, or O.

2. Light-sensitive material according to claim 1 in which the layer also contains a binder.

3. Light-sensitive material according to claim 1 in which the layer also contains a cross-linking agent.

4. Light-sensitive material according to claim 1 in which the layer is on a support suitable for use in planographic printing.

5. Light-sensitive material according to claim 1 in which the halogenated organic compound has the formula

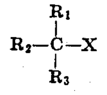

in which X is selected from the group consisting of chlorine, bromine, or iodine; and $R_1$, $R_2$, and $R_3$ are selected from the group consisting of chlorine, bromine, iodine, hydrogen, and alkyl, aryl, aralkyl, alkenyl, and heterocyclic groups.

6. Light-sensitive material according to claim 1 in which the halogenated organic compound is selected from the group consisting of tetrabromomethane, tribromomethylphenylsulfone, iodoform, pentabromoethane. 3-nitro-tribromoacetophenone, and 2,5-dimethyl-tribromoacetophenone.

7. Light-sensitive material according to claim 1 in which the C-vinyl compound is selected from the group consisting of 2-vinyl-4-(4′-diethylaminophenyl)-5-(2″-chlorophenyl)-oxazole, and 2,3-di-(4-vinylphenyl)-quinoxaline.

8. A process for making a printing plate which comprises exposing a supported light-sensitive photopolymerizable layer to light under a master and developing the resulting image by dissolving away the unexposed areas, the layer containing a photolytically effective halogenated organic compound and at least one C-vinyl compound corresponding to one of the general formulae:

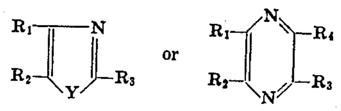

in which $R_1$ and $R_2$ are selected from the group consisting of aryl and pyridyl groups or, taken together from members of an aromatic or pyridine ring; $R_3$ is selected from the group consisting of $-CH{=}CH_2$ or $-RCH{=}CH_2$, in which R is selected from the group consisting of arylene and naphthalene groups; $R_4$ is selected from the group consisting of groups identical with $R_3$ and aryl groups; and Y is selected from the group consisting of NH, S, Se, or O.

9. A process according to claim 8 in which the layer also contains a binder.

10. A process according to claim 8 in which the layer also contains a cross-linking agent.

11. A process according to claim 8 in which the halogenated organic compound has the formula

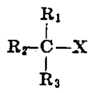

in which X is selected from the group consisting of chlorine, bromine, or iodine; and $R_1$, $R_2$, and $R_3$ are selected from the group consisting of chlorine, bromine, iodine, hydrogen, and alkyl, aryl, aralkyl, alkenyl, and heterocyclic groups.

12. A process according to claim 8 in which the halogenated organic compound is selected from the group consisting of tetrabromomethane, tribromomethylphenylsulfone, iodoform, pentabromoethane, 3-nitrotribromoacetophenone, and 2,5-dimethyltribromoacetophenone.

13. A process according to claim 8 in which the C-vinyl compound is selected from the group consisting of 2-vinyl4-(4'-diethylaminophenyl)-5-(2''-chlorophenyl)-oxazole, and 2,3-di-(4-vinylphenyl)-quinoxaline.

* * * * *